United States Patent
Leduc et al.

(10) Patent No.: US 10,797,103 B2
(45) Date of Patent: Oct. 6, 2020

(54) METHOD FOR PRODUCING A BOLOMETRIC DETECTOR

(71) Applicant: COMMISSARIAT A L'ENERGIE ATOMIQUE ET AUX ENERGIES ALTERNATIVES, Paris (FR)

(72) Inventors: Patrick Leduc, Grenoble (FR);
Sebastien Cortial, Sassenage (FR);
Stephane Pocas, Grenoble (FR);
Jean-Jacques Yon, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/968,863

(22) Filed: May 2, 2018

(65) Prior Publication Data
US 2018/0331155 A1 Nov. 15, 2018

(30) Foreign Application Priority Data
May 9, 2017 (FR) ...................................... 17 54060

(51) Int. Cl.
*H01L 27/16* (2006.01)
*G01J 5/20* (2006.01)
(Continued)

(52) U.S. Cl.
CPC .............. *H01L 27/16* (2013.01); *G01J 5/024* (2013.01); *G01J 5/12* (2013.01); *G01J 5/20* (2013.01); *H01L 37/025* (2013.01)

(58) Field of Classification Search
CPC .............................. H01L 27/16; H01L 37/025
See application file for complete search history.

(56) References Cited

U.S. PATENT DOCUMENTS

| 5,912,464 A | 6/1999 | Vilain et al. |
| 9,389,125 B2 | 7/2016 | Yon et al. |
| (Continued) | | |

FOREIGN PATENT DOCUMENTS

| DE | 100 58 864 A1 | 6/2002 |
| EP | 0 828 145 A1 | 3/1998 |
| (Continued) | | |

OTHER PUBLICATIONS

U.S. Appl. No. 15/283,683, filed Oct. 3, 2016, 2017/0098638 A1, Aurelie Thuaire, et al.
(Continued)

*Primary Examiner* — Moazzam Hossain
*Assistant Examiner* — Hajar Kolahdouzan
(74) *Attorney, Agent, or Firm* — Oblon, McClelland, Maier & Neustadt, L.L.P.

(57) ABSTRACT

A method for producing a bolometric detector comprising producing a stack, on an interconnect level of a read-out circuit, comprising a sacrificial layer positioned between a carrier layer and an etch stop layer, the sacrificial layer comprising a mineral material; producing a conducting via passing through the stack such that it is in contact with a conducting portion of said interconnect level; depositing a conducting layer onto the carrier layer and the via; etching the conducting layer and the carrier layer, forming a bolometer membrane electrically connected to the via by a remaining portion of the conducting layer that covers an upper part of the via; and elimination of the sacrificial layer by selective chemical etching, and such that the membrane is suspended by the via.

12 Claims, 5 Drawing Sheets

(51) Int. Cl.
*G01J 5/02* (2006.01)
*G01J 5/12* (2006.01)
*H01L 37/02* (2006.01)

(56) References Cited

U.S. PATENT DOCUMENTS

| | | | |
|---|---|---|---|
| 2014/0226021 A1 | 8/2014 | Koechlin et al. | |
| 2014/0319350 A1* | 10/2014 | Yon | G01J 5/20 |
| | | | 250/338.4 |
| 2015/0053858 A1* | 2/2015 | Imperinetti | G01J 5/0285 |
| | | | 250/338.1 |

FOREIGN PATENT DOCUMENTS

| | | |
|---|---|---|
| EP | 2 743 659 A1 | 6/2014 |
| FR | 2 977 937 A1 | 1/2013 |

OTHER PUBLICATIONS

U.S. Appl. No. 15/746,041, filed Jan. 19, 2018, Frank Fournel, et al.
French Preliminary Search Report dated Feb. 6, 2018 in French application 17 54060 filed on May 9, 2017(with English Translation of Categories of Cited Documents).

* cited by examiner

METHOD FOR PRODUCING A BOLOMETRIC DETECTOR

TECHNICAL FIELD AND PRIOR ART

The invention relates to the field of bolometer or microbolometer electromagnetic radiation detectors intended to detect radiation in the "thermal" or infrared region.

The term "bolometer" is used in a generic manner herein, regardless of the dimensions of the bolometer, and thus refers to both a bolometer or a microbolometer of micrometric dimensions.

A bolometer detector, or bolometric detector, generally comprises a set of bolometers positioned at the surface of a carrier substrate to form an array. Each of the bolometers is intended to provide thermal information relative to a pixel of an image provided by the detector.

Each bolometer comprises a suspended membrane mechanically and electrically connected to the substrate by means of long narrow beams called support arms and connected to electrically conducting pillars enabling the membrane to be suspended. The assembly is placed in a sealed enclosure, for example a casing under very low pressure, in order to suppress the thermal conductance of the surrounding gas.

During operation of the detector, the membrane of each bolometer heats up by absorbing the incident radiation originating from the observed thermal scene, said radiation being transmitted and focused on the bolometer array by an appropriate optical system at the level of the focal plane array. Said membrane comprises a thermoelectric signal transduction device having an electric property (for example resistivity) that strongly varies when the temperature changes, for example generating a current variation, i.e. an electric signal, when said material is under a constant biasing, the amplitude of which is a function of the incident radiation flow. The signal obtained corresponds to the image of the temperature of the detector. Such a thermoelectric signal transduction device corresponds, for example, to a layer of transducer material, for example a metal oxide ($VO_x$, $NiO_x$, $TiO_x$) or amorphous silicon (a-Si), or a diode or a transistor.

Conventional methods of manufacturing such detectors, of the "above IC" or "MEMS on top" type, comprise steps directly carried out at the surface of a substrate generally made of silicon and comprising a plurality of electronic circuits forming the read-out integrated circuit or ROIC, in a so-called monolithic fashion. The term "monolithic" refers to a continuous sequence of operations carried out using the same substrate, after the read-out integrated circuit manufacturing process.

The steps for manufacturing bolometers are generally carried out to collectively manufacture a plurality of detectors, for example from a few tens to a few hundred thereof on the same substrate.

During these steps, the bolometer elements implementing the radiation absorption, optothermal signal transduction, and thermoelectric signal transduction functions are positioned at the surface of a sacrificial layer intended to form a construction base and to be removed at the end of the process by an appropriate method that does not attack the other elements (the structural and active members) of the structure. The sacrificial layer generally corresponds to an organic polyimide layer, which is then removed by combustion in an oxygen plasma.

The dielectric or semi-conductive layers that form the elements of the detection structure are conventionally made of silicon oxide (SiO), silicon nitride (generically written SiN) or amorphous silicon, as disclosed, for example, in document EP 0 828 145 A1. These materials can be deposited at a relatively low temperature and are inert relative to the method of removing the organic sacrificial layer carried out under an oxygen plasma, that is to say they are not etched by the oxygen plasma.

After etching the sacrificial layer, the membranes of the bolometers remain suspended above the substrate without any contact or attachment other than the support arms thereof.

The bolometers are, for example, made by forming an array with a repeating pitch (distance separating the centres of two neighbouring bolometers positioned in the same row or same column of the array) equal to 17 µm, or even of about 12 µm or 10 µm.

In order to carry out a "far" infrared detection (LWIR), the detector generally comprises a quarter-wave plate or cavity formed between the membrane and a reflector positioned at the surface of the substrate, in order to provide the detector with a maximum level of absorption for wavelengths in the vicinity of 10 µm. Thus, in order to connect and hold the membrane at a suitable distance from the reflector and with good mechanical support, the electrically conducting pillars produced are rather complex and have non-negligible overall dimensions, and are formed through a thick polyimide layer (generally having a thickness that lies in the range 2 µm to 2.5 µm) forming the sacrificial layer, the thickness of said sacrificial polyimide layer corresponding to the desired distance between the membrane and the reflector.

Document EP 2 743 659 A1 proposes to partially integrate the bolometers into the "back-end" layers (or "BEOL" for "Back End Of Line") of the read-out integrated circuit of the bolometers. The acronym BEOL refers to the steps of manufacturing all metal interconnections carried out at a relatively low temperature, typically less than about 400° C., and which are characteristic of the end of standard microelectronic manufacturing processes. The purpose of this so-called "MEMS-in-CMOS" approach is to use certain BEOL layouts that are mature on an industrial level to integrate part of the bolometer elements. In particular, metallised vias obtained using a "damascene" method, are produced to form the electrically conducting pillars of the bolometers, and one of the IMDs ("Inter-Metal-Dielectrics"), for example comprising SiO, which is a standard material in microelectronics, is used as a sacrificial layer on which the membranes of the bolometers are produced.

The removal of such a sacrificial layer requires the use of vapour-phase hydrofluoric acid (HFv). Therefore, all materials forming the bolometer are chosen to be inert relative to this very chemically aggressive method, i.e. from the group of materials not affected by this etching.

By integrating bolometers into the BEOL, the last photolithographic levels of the ROIC normally carried out to conduct an electrical contact at the surface of the passivation layer located at the apex of the BEOL are also carried out to produce the electrically conducting pillars of the bolometers. A plurality of lithographic levels in the group of levels required to manufacture bolometers are thus avoided, which results in significant savings in the manufacturing costs of said bolometers. Moreover, the electrically conducting pillars, cylindrical in shape, thus produced benefit from the CMOS routing rules, i.e. a diameter equal to about 0.5 µm, which represents very significant compactness savings compared to the electrically conducting pillars generally produced using "above IC" technology, which generally occupy a surface area of about 3×3 µm². These space savings can represent a decisive advantage in a context of reducing the pitch of bolometric array detectors.

In the structure disclosed by document EP 2 743 659 A1, the electrical connection between the electrically conducting pillars and the metal present in the membrane of the bolometer in order to ensure absorption of the electromagnetic radiation can be obtained indirectly via a carrier layer of the membrane comprising amorphous silicon. However, the electrical resistivity of this non-metallic amorphous silicon layer is very high compared to metal and introduces, despite its small thickness, a parasitic electrical resistance in series with the thermoelectric signal transducer element, which is detrimental to the sensitivity of the micro-detectors.

In order to overcome this restriction, document EP 2 743 659 A1 further discloses another embodiment wherein an electrical contact is provided through the carrier layer of the membrane made of amorphous silicon by means of an opening made through said carrier layer, in order to overcome the aforementioned drawbacks. This contact, and therefore the opening in which this contact is made, must fall within the cross-section of the electrically conducting pillar so that the metal layer present in the membrane of the bolometer can create a reliable electrical continuity with the metal forming the electrically conducting pillar. This arrangement reveals two key points:

the definition of the contact by photolithography and the alignment thereof on the electrically conducting pillar is very delicate and sometimes impossible when the diameter of the electrically conducting pillar is reduced to the minimum dimension allowed by the photolithography means, however which constitutes one of the main advantages of this "MEMS in CMOS" construction of the bolometer. More specifically, producing a contact inside a section, the diameter of which is equal to 0.5 µm requires the use of advanced lithographic means not available in a conventional BEOL line, the contact is made through the amorphous silicon layer, the thickness of which is generally equal to 50 nm. The resulting topography must not create any discontinuity in the metal layer of the bolometer deposited in the contact. This layer, which must be very thin (typically 10 nm) since it also serves as a radiation absorber in the bolometric membrane, will not be very effective in covering the sides of the contact etched in the amorphous silicon carrier layer.

Moreover, another drawback of this solution concerns the addition of a lithographic and etching level for producing the opening in which the contact must be produced, which generates additional manufacturing costs.

DESCRIPTION OF THE INVENTION

Thus there is a need to propose a method for producing a bolometric detector wherein the one or more bolometers are partially produced within the BEOL of the electronic read-out circuit of the detector, and which overcomes the aforementioned drawbacks concerning the electrical contact between the membrane of a bolometer and at least one of the electrically conducting pillars from which the membrane of said bolometer is suspended.

For this purpose, one embodiment proposes a method for producing a bolometric detector comprising at least the implementation of the following steps:

producing a stack of layers on an electrical interconnect level of an electronic read-out circuit of the detector, the stack comprising at least one sacrificial layer positioned between a carrier layer and a first etch stop layer, the first etch stop layer being positioned between the sacrificial layer and said electrical interconnect level, and the sacrificial layer comprising at least one mineral material capable of being selectively etched relative to the carrier layer and the first etch stop layer;

producing at least one electrically conducting via passing through at least the stack of layers such that at least one electrically conducting material of the via is in contact with at least one electrically conducting portion of said electrical interconnect level connected to the electronic read-out circuit;

depositing at least one electrically conducting layer onto the carrier layer and the via;

etching the electrically conducting layer and the carrier layer, forming a bolometer membrane electrically connected to the electrically conducting via by at least one remaining portion of the electrically conducting layer that covers at least one upper part of the via;

eliminating the sacrificial layer by chemical etching to which the first etch stop layer and the carrier layer are resistant, and such that the membrane is suspended by means of the via.

In this method, the one or more bolometers are produced on an electric interconnect level of the electronic read-out circuit and by using a mineral sacrificial layer, and are thus partially integrated into the BEOL of said circuit.

Moreover, due to the fact that the electrically conducting layer is deposited directly on the electrically conducting via acting as a pillar for suspending the membrane, and that the electrically conducting via is produced after having formed the carrier layer, the electrical contact between the electrically conducting layer of the membrane and the electrically conducting via is made directly between said two elements, without the presence of any semi-conductive material therebetween.

This method is used to form a direct electrical connection between the electrically conducting via and the electrically conducting layer of the membrane which benefits from lower overall dimensions due to the fact that a large contact area of the electrically conducting pillar is not required to perform the alignment with an opening formed through the carrier layer as is the case in the prior art. The electrically conducting via can therefore be produced with smaller dimensions than in the prior art, for example with a diameter or a side, the dimensions of which are about 0.5 µm.

Moreover, since the electrical contact between the electrically conducting via and the electrically conducting layer is not formed in an opening passing through the carrier layer, a small thickness of the electrically conducting layer is not detrimental to the reliability of the contact.

Finally, with regard to the method requiring the production of an opening passing through the carrier layer of the membrane in order to produce the contact between the electrically conducting pillar and the electrically conducting layer of the membrane, this method further allows a level of photolithography and etching to be avoided, due to the non-production of such an opening in said method.

This method is used to obtain excellent electrical continuity between the read-out circuit and the membrane of the bolometer since the electrical connection between the read-out circuit and the electrically conducting material of the membrane is solely formed of electrically conducting materials.

The above advantages are obtained, regardless of the material of the carrier layer.

The stack of layers may further comprise a second etch stop layer such that the carrier layer is positioned between the second etch stop layer and the sacrificial layer, the method may further comprise, between the production of the via and the deposition of the electrically conducting layer, the implementation of the following steps of:

removing, for example by chemical-mechanical polishing, a layer of electrically conducting material formed on the second etch stop layer during production of the via, then eliminating the second etch stop layer, and the electrically conducting layer can be deposited such that the remaining portion of the electrically conducting layer also covers the sides of the upper part of the via uncovered (or bared or revealed) by the elimination of the second etch stop layer.

Since the upper part of the electrically conducting via "protrudes" from the carrier layer, and therefore since the mechanical holding of the carrier layer by the via takes place beneath this upper part, the mechanical holding of the carrier layer, and therefore of the membrane, to the electrically conducting via is improved. Furthermore, since the remaining portion of the electrically conducting layer covers, in addition to the top surface of the via, the sides of said upper part of the via, the contact area between this portion of the electrically conducting layer and the electrically conducting via increases, and the electrical contact between the electrically conducting layer and the electrically conducting via is thus improved.

The carrier layer may comprise at least one dielectric material or a material wherefore at least one electric parameter varies according to the temperature thereof. Therefore, the carrier layer performs an electrical insulation or thermoelectric signal transduction function within the membrane of the bolometer.

The method may further comprise, before the elimination of the sacrificial layer, the production of at least one element for absorbing the infrared radiation intended to be detected by the detector, on the membrane.

In such a case, the absorbing element may comprise at least one MIM (or "Metal-Insulator-Metal") structure. Other types of absorbing elements can be produced on the membrane.

The expression "MIM structure" refers to a stack comprising at least one dielectric element positioned between an upper metal element and a lower metal element, and capable of performing the selective absorption of certain wavelengths according to the dimensions and materials of the MIM structure.

The electrically conducting layer may be etched such that a plurality of remaining portions of said electrically conducting layer form bolometer electrodes and resistive portions capable of absorbing infrared radiation intended to be detected by the detector. These resistive portions can take on any shape.

The method may further comprise, between the etching of the electrically conducting layer and the etching of the carrier layer (the carrier layer being etched after the electrically conducting layer), the deposition of a first thermoelectric signal transduction layer on the remaining portions of the electrically conducting layer and on the carrier layer. Such a first thermoelectric signal transduction layer may be deposited on the electrically conducting layer and on the carrier layer. In addition to the electrical connection between the conducting layer and the thermoelectric signal transduction layer, this arrangement also compensates for a bimetal effect occurring between the portions of the electrically conducting layer and the carrier layer.

The first thermoelectric signal transduction layer may comprise at least one material that is resistant to the chemical etching process implemented to eliminate the sacrificial layer. In such a case, this first thermoelectric signal transduction layer can also act to protect the electrically conducting layer relative to the etching solution used to etch the sacrificial layer.

The method may further comprise, after the deposition of the first thermoelectric signal transduction layer, the deposition of a second thermoelectric signal transduction layer on the first thermoelectric signal transduction layer, the thickness of which is greater than that of the first thermoelectric signal transduction layer. In such a case, the signal-to-noise ratio of the conversion of the heat energy absorbed into electrical energy taking place in the detector is improved. The second thermoelectric signal transduction layer may comprise at least one material that is resistant to the chemical etching process implemented to eliminate the sacrificial layer.

This second thermoelectric signal transduction layer may then be etched in order to form one or more portions of thermometric material on the membrane, for example a central portion of thermometric material.

The method can be such that:

the carrier layer comprises amorphous silicon, and/or if a first thermoelectric signal transduction layer is deposited, the first thermoelectric signal transduction layer comprises amorphous silicon, and/or if a second thermoelectric signal transduction layer is deposited, the second thermoelectric signal transduction layer comprises amorphous silicon.

BRIEF DESCRIPTION OF THE FIGURES

This invention will be better understood after reading the following description of embodiments, given for purposes of illustration only and not intended to limit the scope of the invention, and with reference to the accompanying figures, wherein.

Figure 1A:
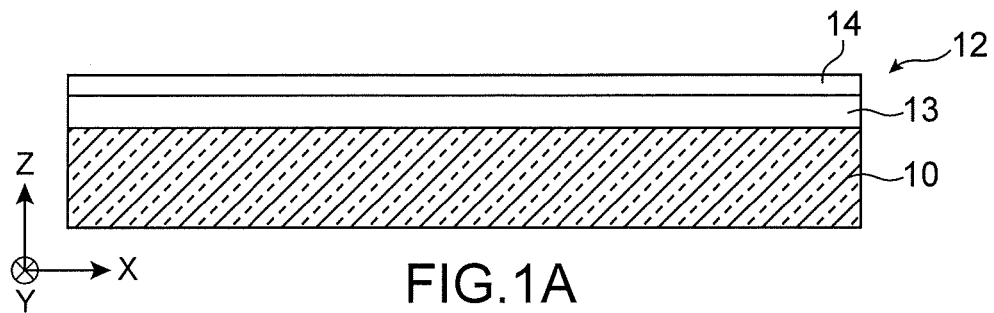
FIGS. 1A to 1N show the steps of a method for producing a bolometric detector according to a first embodiment.

Identical, similar or equivalent parts of the different figures described herein below carry the same numerical references in order to ease the passage from one figure to another.

The different parts shown in the figures are not necessarily displayed according to a uniform scale in order to make the figures easier to read.

The different production possibilities (alternatives and embodiments) must be understood as not being exclusive with regard to each other and can be combined together.

DETAILED DESCRIPTION OF THE SPECIFIC EMBODIMENTS

A method for producing an infrared bolometric detector 100 according to a first embodiment is described herein below with reference to FIG. 1A to 1N.

The device 100 produced in this first embodiment comprises a plurality of thermal detectors, of the microbolometer type, produced from a semi-conductive substrate 10, for example silicon, on and/or in which is integrated an electronic read-out circuit 12 made using CMOS technology. The read-out circuit 12 reads the electrical characteristic variation induced by the heating of each of the bolometers, and also the biasing of the bolometers.

The electronic read-out circuit 12 comprises semi-conductor layers 13 ("Front End" part) in which transistors, diodes, capacitors and other MOS-type electronic devices are produced, allowing the electronic functions of the read-out circuit 12 to be performed. One or more electrical interconnect levels 14 ("Back End" part) in particular connecting functional units of the read-out circuit 12 together and intended to form input/output connections of the read-out circuit 12, are produced on the semi-conductor layers 13 of the read-out circuit 12.

The last electrical interconnect level intended to form the electrical contacts of the read-out circuit 12 has not yet been produced at the stage shown in FIG. 1A. In FIG. 1A, the reference numeral 14 can therefore designate a single electrical interconnect level, corresponding to both the first electrical interconnect level and to the penultimate electrical interconnect level, or a plurality of stacked electrical interconnect levels from the first electrical interconnect level (that in contact with the semi-conductor layers 13) to the penultimate electrical interconnect level. The last electrical interconnect level will be produced such that it integrates the bolometers intended to be produced such that it is suspended above the read-out circuit 12 and provides the electrical connections between the inputs of the read-out circuit 12 accessible from the electrical interconnect levels 14 and the output electrical connections of the bolometers. This last electrical interconnect level is also produced such that it forms electrical connection pads of the read-out circuit 12 accessible externally, i.e. capable of being electrically contacted from outside the detector 100.

Alternatively, a plurality (for example 2 or 3) of last electrical interconnect levels can be used to form the mechanical support means of the bolometers and the electrical connection means between the inputs of the read-out circuit 12 and the output electrical connections of the bolometers.

Figure 1B:
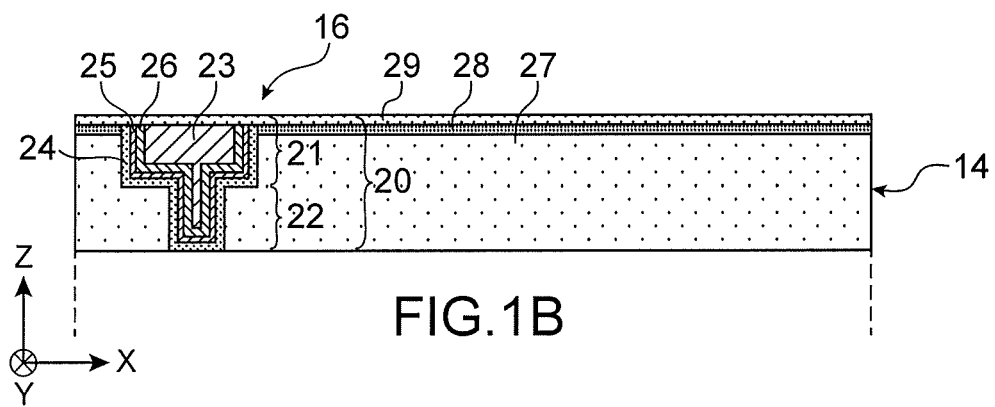

FIG. 1B shows the penultimate electrical interconnect level 20 produced, forming a part of the electrical interconnect levels 14 and on which the bolometers of the detector 100 are intended to be produced. This electrical interconnect level 20 in particular comprises a metal line 21, the portions 16 of which (a single portion 16 is shown in FIG. 1B) are electrically and locally connected, by means of electrically conducting vias 22, or vertical connections, and possibly by means of the one or more lower electrical interconnect levels, to the MOS electronic devices of the read-out circuit 12. At least one part of these portions 16 are intended to be electrically connected to the bolometers of the detector 100. Outside of the vias 22 which provide the electrical connections with the lower electrical interconnect level, the electrical interconnect level 20 is electrically insulated from the metal line of the lower electrical interconnect level by a dielectric layer 27, called an inter-metal dielectric (or IMD), which is a mineral material and for example, composed of undoped silicon oxide (also called USG or "Undoped Silica Glass"), or of an oxide with a lower dielectric permittivity, such as SiOF, SiOC or SiOCH, etc.

The electrical interconnect level 20 can further comprise other portions (not shown in FIG. 1B) of the metal line 21, connected or not connected to the lower electrical interconnect level, intended to not be connected to the bolometers but to be used, for example, to produce, at least partially, connection pads used for the wiring and testing of the read-out circuit 12 and detector 100 in general.

Different technical options are available for producing the vias 22 and the metal line 21 of the penultimate electrical interconnect level 20 (and also the metal lines and vias of the other electrical interconnect levels 14). A first possibility consists of producing the metal line 21 using aluminium advantageously inserted between two layers of titanium or titanium nitride, and of producing the vias 22 using tungsten. A second possibility involves producing the metal line 21 and the vias 22 using copper according to a damascene method comprising filling trenches formed in the dielectric layer 27, or inter-metal dielectric, with copper. This can be a simple damascene method wherein two successive damascene steps are performed to produce the vias 22 then the metal line 21, or a dual damascene method as shown in FIG. 1B, wherein the steps of producing the metal line 21 and the vias 22 are integrated into a "continuous" manufacturing process. The core of said elements 21 and 22 is formed from copper portions 23 produced by the electrolysis of a copper salt solution (ECD). The bottom surfaces and the side surfaces of said copper portions 23 are further coated in a set of conductive layers, for example made of tantalum nitride 24, tantalum 25 and copper 26, advantageously produced by ionising cathodic sputtering (also called iPVD) in order to improve the coating of said deposits on the vertical sides. The tantalum layer 25 forms a barrier layer preventing the diffusion of the copper 23 and 26 into the inter-metal dielectric 27 and to the semi-conductor layers 13 of the read-out circuit 12, where, if not prevented, the copper would create electrical defects, in particular in the transistors and diodes. The tantalum nitride layer 24 is generally provided to improve adhesion of the tantalum layer 25 to the surface of the inter-metal dielectric 27. The copper layer 26 acts both as a cathode and as a seed layer for the electrolytic growth of the copper portions 23. The flush-fitting of the interconnect level 20 with the surface of the inter-metal dielectric 27 is obtained by chemical-mechanical polishing (CMP) controlled by a stop layer 28, for example comprising $SiO_2$.

An insulating dielectric layer 29 covers the stop layer 28 and the top surfaces of the different portions of the metal line 21. This layer 29 corresponds, in this case, to a bilayer formed by stacking a first layer positioned on the stop layer 28 and a second layer covering said first layer. The first layer of said stack is intended to form a diffusion barrier with regard to the copper of the metal line 21, and comprises, for example, silicon nitride. The second layer of the stack forms an etch stop layer capable of withstanding HFv etching implemented at a later time during the liberation of the membranes of the bolometers, which will thus protect the electrical interconnect level 20 during the liberation of the bolometers. This second layer of the stack comprises, for example, $Al_2O_3$ or AlN.

In the following figures, the metal line 21 and the vias 22 are shown in a less detailed manner than in FIG. 1B for easier reading.

Figure 1C:
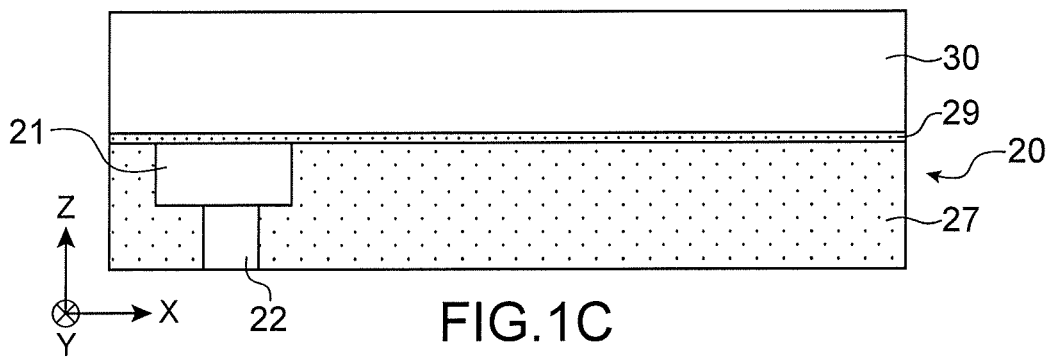

A sacrificial layer 30, comprising at least one mineral material such as $SiO_2$, is deposited on the layer 29 (FIG. 1C). The thickness (dimension along the Z axis) of the sacrificial layer 30 lies, for example, in the range 1 μm to 5 μm approximately. The thickness of the sacrificial layer 30 is in particular chosen as a function of the desired absorption properties relative to infrared radiation intended to be received and absorbed by the bolometers of the detector 100. This thickness is, for example, chosen such that the space freed by the subsequent etching of the sacrificial layer 30 forms, beneath the membrane of the bolometers, a quarter-wave cavity (in particular when the detector 100 is intended to detect infrared radiation, the wavelength of which falls within band III for example (between 8 and 12 μm)). The thickness of the sacrificial layer 30 can be adjusted, after the deposition thereof, by the implementation of CMP-type planarization.

Figure 1D:
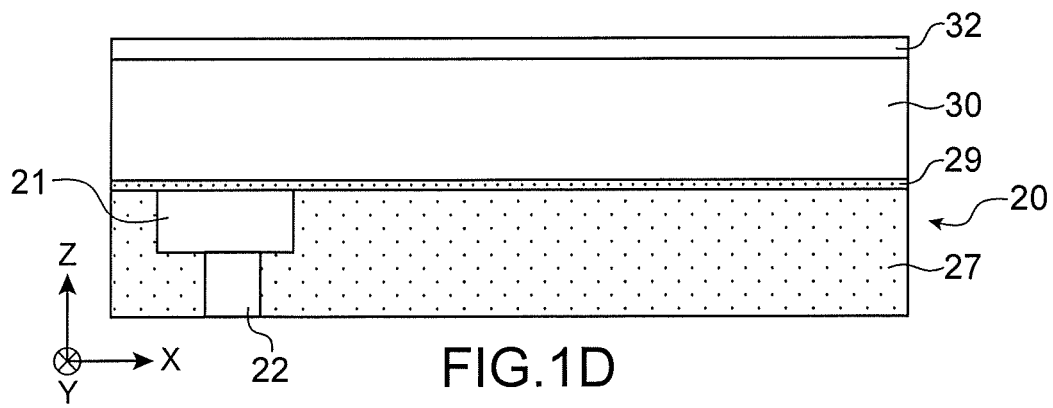

As shown in FIG. 1D, a carrier layer 32 is then deposited on the sacrificial layer 30. The carrier layer 32 can comprise at least one temperature-sensitive material, for example the resistivity whereof varies substantially with the temperature. In such a case, the carrier layer 32 comprises, for example, amorphous silicon deposited by CVD. Alternatively, the carrier layer 32 can comprise at least one material forming an electrical insulator or with significant resistivity. Therefore, in addition to the amorphous silicon, the carrier layer 32 can comprise SiC, $Al_2O_3$, or AlN, etc. In all cases, the one or more materials of the carrier layer 32 are inert relative to the HFv etching implemented at a later time during the etching of the sacrificial layer 30, i.e. they are capable of withstanding (not being etched) the one or more chemical etching solutions used to etch the sacrificial layer 30. Therefore, the material of the sacrificial layer 30 is capable of being selectively etched relative to the carrier layer 32 and the first etch stop layer 29.

Moreover, the carrier layer 32 can correspond to a stack of a plurality of different materials, for example a bilayer, such that the lower layer of said stack (that in contact with the sacrificial layer 30) protects the one or more other upper layers of said stack during the etching of the sacrificial layer 30.

The thickness of the carrier layer 32 lies, for example, in the range 10 nm to 100 nm approximately.

Figure 1E:
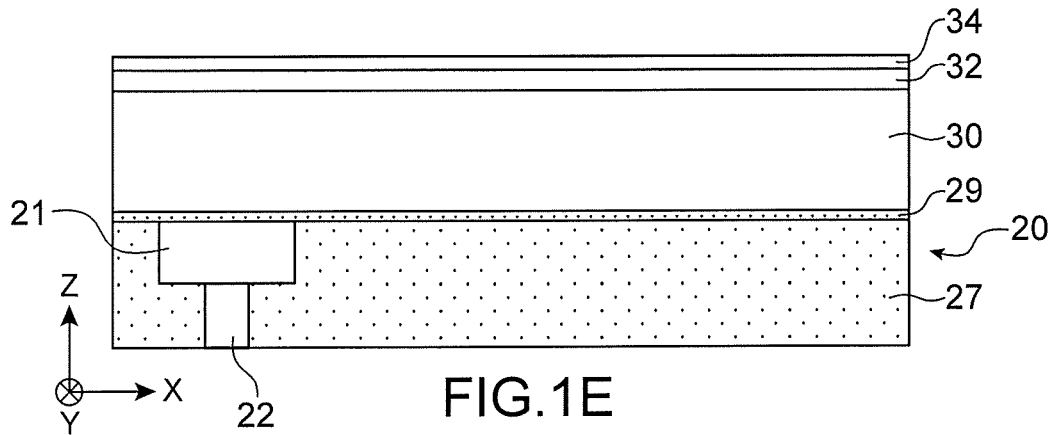

A second etch stop layer 34 is then deposited on the carrier layer 32 (FIG. 1E). This layer 34 is intended to stop an ablation or planarization process implemented at a later time to remove excess conductive material formed during the production of electrically conducting vias connecting the bolometers to the metal line 21, in order to prevent deterioration of the layer 32 during this removal of conductive material. The layer 34 comprises at least one material that is resistant to mechanical and/or chemical and/or ionic abrasion that will be implemented, preferably corresponding to at least one material already used during the production of the elements found in the semi-conductor layers 13, for example SiN and/or SiO. The layer 34 has, for example, a thickness of between about 20 nm and 100 nm.

Figure 1F:
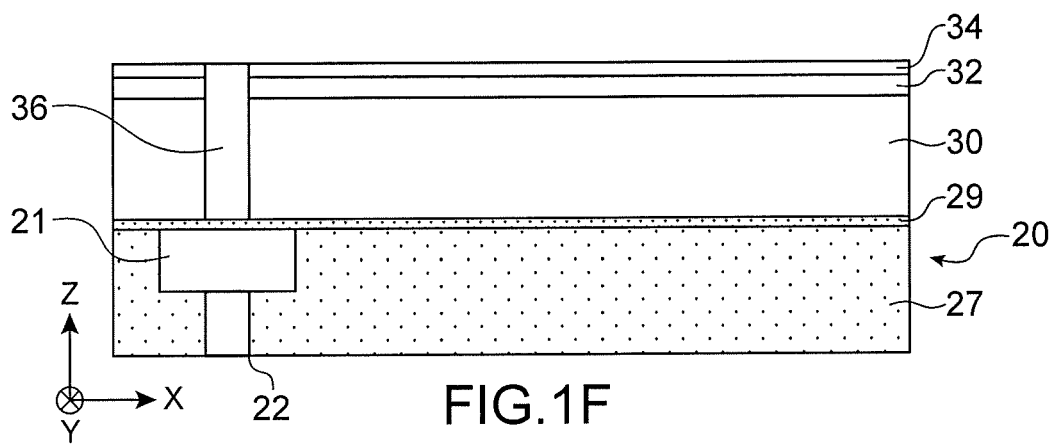
Figure 1G:
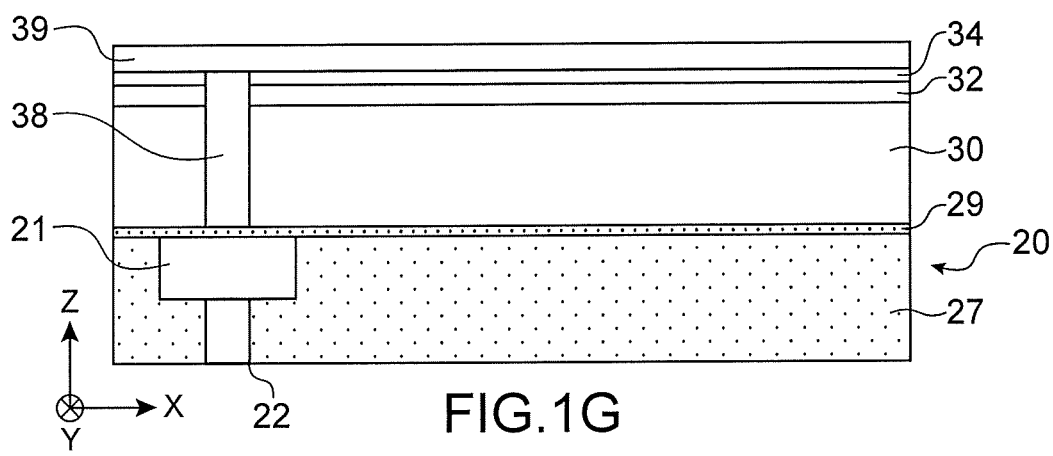
Figure 1H:
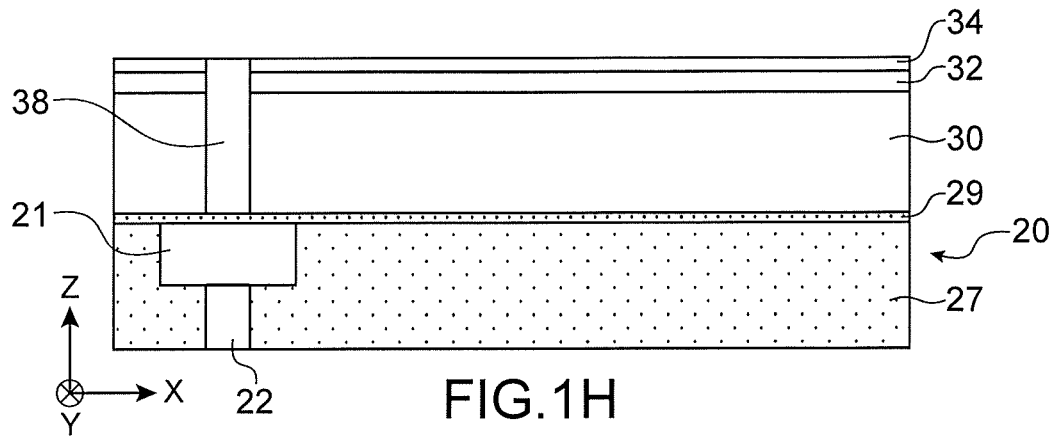

Electrically conducting vias 38 are then produced through the stack of layers previously formed on the electrical interconnect level 20. FIG. 1F to 1H describe the production of a single electrically conducting via 38. However, a plurality of electrically conducting vias are produced through said stack. The number of said vias 38 depends on the number of bolometers that the detector 100 is intended to contain. Said electrically conducting vias 38 are intended to provide the electrical connections between the bolometers of the detector 100 and the read-out circuit 12, as well as to mechanically hold the membranes of the bolometers in suspension.

As shown in FIG. 1F, an opening 36 is etched through the stack formed from the layers 34, 32, 30 and 29 previously produced. Said opening 36 forms an access to the metal line 21 and is intended for the production of one of the electrically conducting vias 38. The shape and dimensions of the section of the opening 36, in a plane of the layers 34, 32, 30 and 29 at the interfaces between said layers through which passes said opening 36, define the shape and the dimensions of the via 38 that will be produced in said opening 36, whereby said shape can be, for example, circular or polygonal, the diameter or a dimension of one side of said opening capable of being equal to about 0.5 µm.

The opening 36 is then filled with one or more electrically conducting materials, thus forming the electrically conducting via 38. A thin barrier layer, comprising for example TiN, is for example deposited against the walls of the opening 36 (at the bottom and against the side walls), then the remaining empty volume inside the opening 36 is filled with another electrically conducting material, for example tungsten deposited by CVD. The barrier layer present at the bottom of the opening 36, between the metal line 21 and the other electrically conducting material positioned in the opening 36, prevents a chemical reaction from taking place between the electrically conducting material (for example copper) of the metal line 21 and said other electrically conducting material (for example tungsten) deposited in the opening 36. Said barrier layer present against the side walls of the opening 36 further improves the adherence of said other electrically conducting material deposited in the opening 36.

Alternatively, the metallisation of the electrically conducting via 38 can be obtained using copper. The aforementioned different embodiments of the metal line 21 and of the vias 22 can apply for the production of the electrically conducting via 38.

After the deposition of the one or more electrically conducting materials in the opening 36, a layer 39 of said one or more electrically conducting materials deposited to form the electrically conducting via 38 is present on the layer 34 (FIG. 1G). A removal step, for example by CMP, is implemented in order to remove said layer 39, whereby the layer 34 acts as a stop layer stopping said removal (FIG. 1H).

Figure 1I:
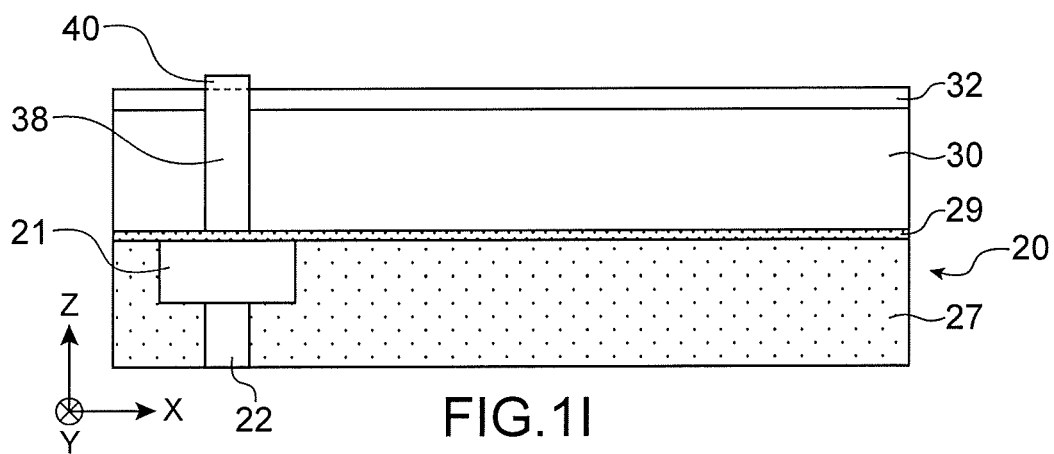

The layer 34 is then removed (FIG. 1I), for example by chemical etching in an aqueous environment, providing a very high etching selectivity relative to the carrier layer 32 underlying the layer 34 and relative to the one or more electrically conducting materials of the electrically conducting via 38. Such an etching calls on, for example, the use of a BOE-type ("Buffered Oxide Etch") etching solution with a diluted HF base. The etching agents are chosen such that the carrier layer 32 is not etched by said etching agents, which can be of the same kind as those used at a later time to etch the sacrificial layer 30. Said etching of the layer 34 reveals an upper part 40 of the electrically conducting via 38 (symbolically delimited from the rest of the via 38 by a dotted line), the sides of which are not covered, at this stage of the method, by any material. The thickness of said upper part 40 is equal to that of the layer 34.

Figure 1J:
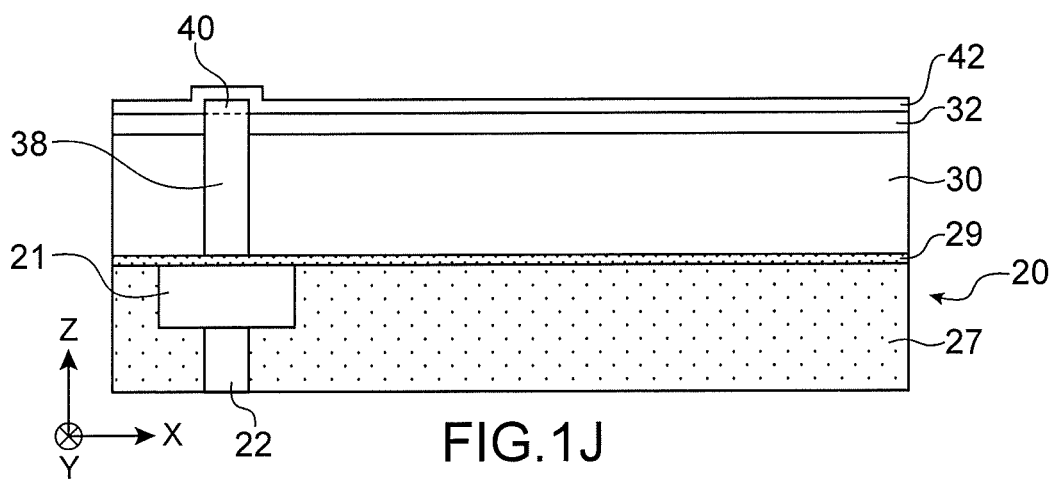

An electrically conducting layer 42 is then deposited on the carrier layer 32 and further covers the upper part 40 of the electrically conducting via 38, and in particular the top surface and the side surfaces of said upper part 40 of the electrically conducting via 38 (FIG. 1J). The layer 42 comprises, for example, TiN. This covering of the upper part 40 of the electrically conducting via 38 by the layer 42 increases the contact area between the conductive material of the layer 42 and the one or more conductive materials of the via 38, and thus improves electrical conduction between the pillar formed from the via 38 and the layer 42. When the membrane of the bolometer produced is liberated by etching the sacrificial layer 30, the fact that the carrier layer 32 surrounds the via 38 at a level located beneath said upper part 40 of the via 38 will increase the mechanical robustness of the assembly.

The bolometer is then completed by producing the different optothermal and thermoelectric signal transduction elements on the carrier layer 32, by etching the carrier layer 32 (and any possible other layers deposited on the carrier layer 32) to form the membrane of the bolometer, and by etching the sacrificial layer 30 in order to liberate said membrane.

Figure 1K:
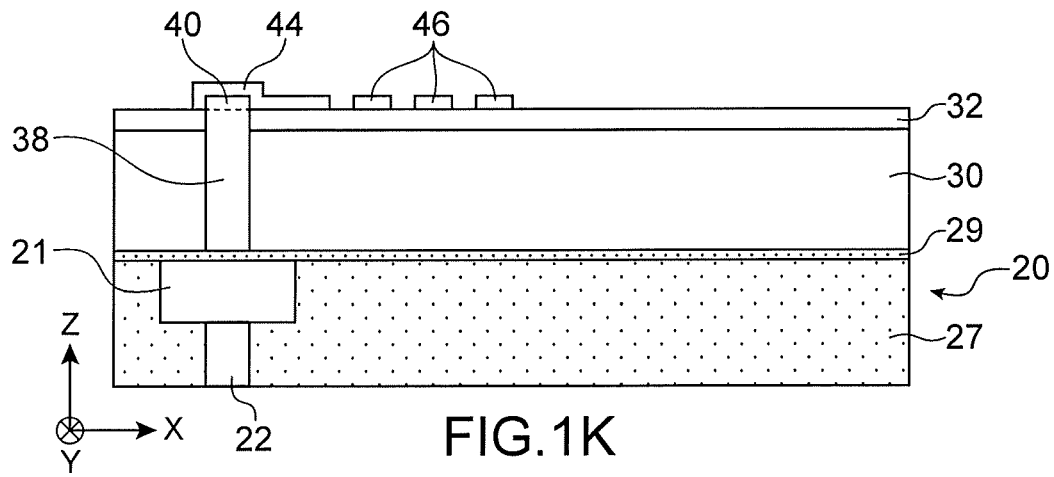

In the first embodiment described herein, the layer 42 is etched such that the remaining portions of this layer form electrodes 44 of the bolometer in direct contact with the one or more conductive materials of the vias 38 (a single electrode 44 is shown in FIG. 1K). Other remaining portions of the layer 42 form resistive portions 46 capable of absorbing the infrared radiation intended to be detected by the detector 100. The portions of the carrier layer 32 made of amorphous silicon that are not covered by the electrodes 44 and the resistive portions 46 will form thermoelectric signal transduction regions of the bolometer. The electrodes 44 and the resistive portions 46 can have different shapes. By way of example, the resistive portions 46 can correspond to two parts of the layer 42 separated from one another by a slot etched through the layer 42 such that current cannot pass between said portions 46. Other shapes and/or a different number of resistive portions 46 can be considered.

Figure 1L:
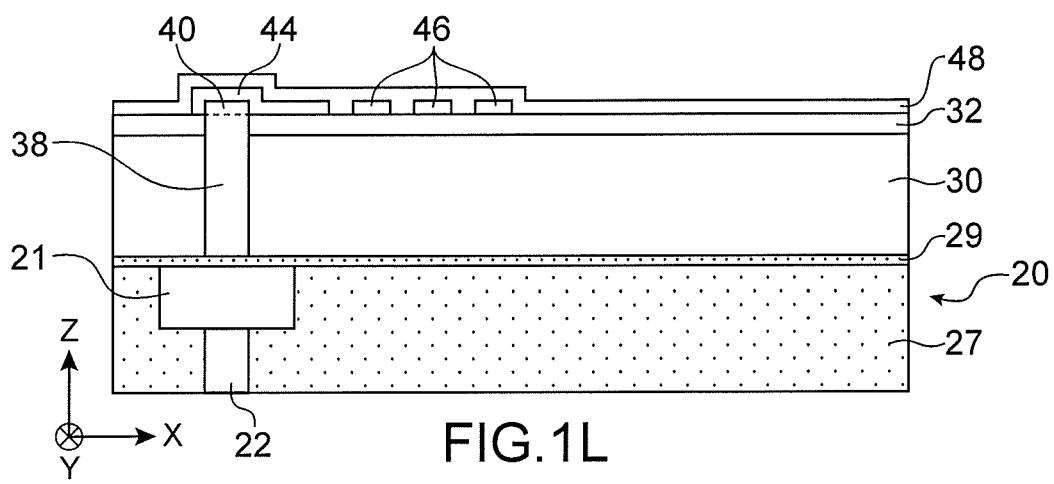

As shown in FIG. 1L, a thermoelectric signal transduction layer 48, called a first thermoelectric signal transduction layer, is deposited on the remaining portions 44, 46 of the layer 42 and on the parts of the carrier layer 32 not covered by said portions 44, 46. Said layer 48, for example comprising amorphous silicon, is intended to ensure, with the carrier layer 32 (since this is also made from amorphous silicon in this first embodiment), the conversion of the infrared radiation received by the bolometer into electrical energy. Furthermore, the layers 32 and 48 compensate for a bimetal effect occurring between the portions 46 of the electrically conducting layer and the carrier layer 32.

Figure 1M:
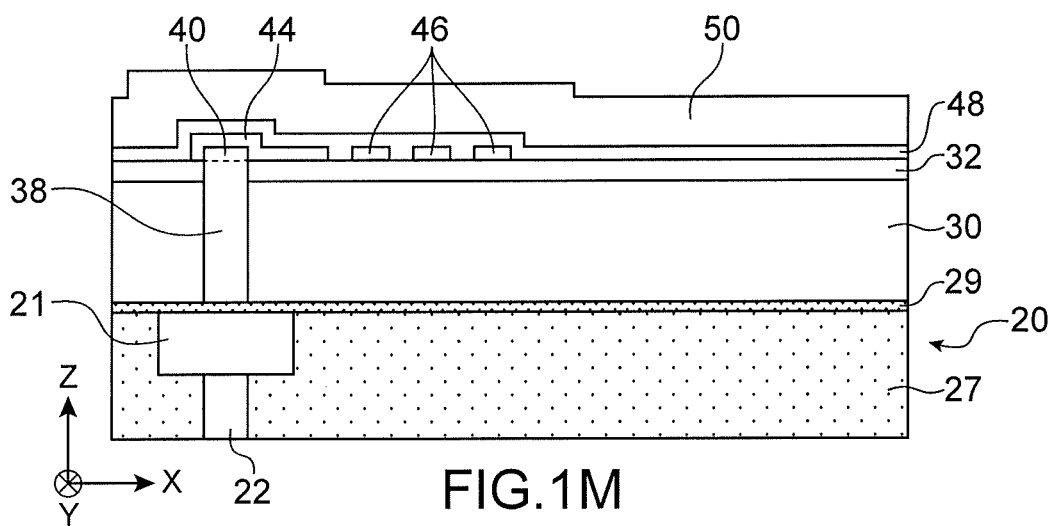
Figure 1N:
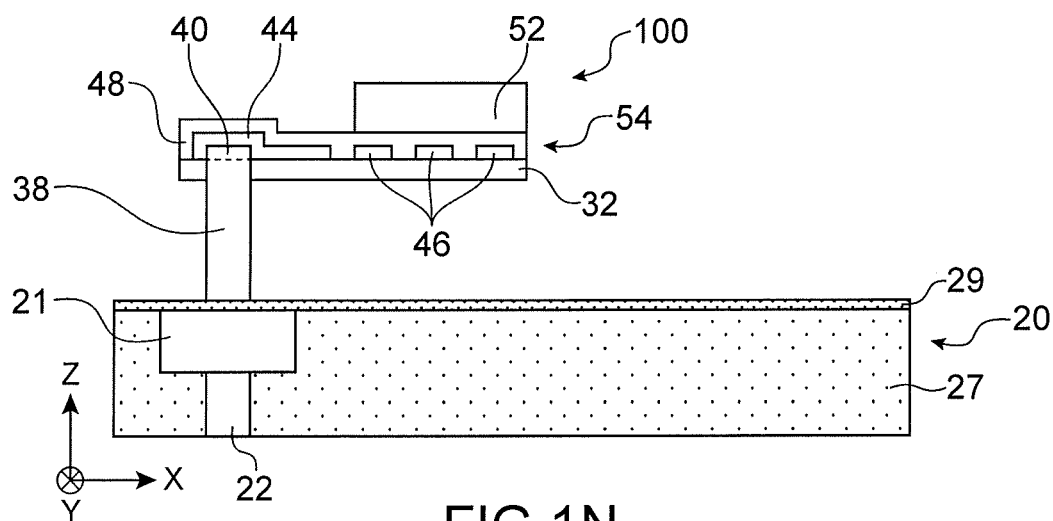

A second thermoelectric signal transduction layer 50 is then deposited on the layer 48 (FIG. 1M). Advantageously, said layer 50 comprises amorphous silicon and has a thickness that is greater than that of the layer 48 and that of the carrier layer 32.

Said second layer 50 is etched such that at least one remaining part 52 of said layer 50 is capable of forming at least one thermoelectric signal transduction element of the bolometer. In the first embodiment described herein, the remaining part 52 forms a central thermometric element of the membrane 54. Advantageously, the parts of the second layer 50 located on the areas intended to form the support arms of the membrane 54 are removed during said etching, which provides the membrane 54 with a high level of thermal insulation. The process of etching the second layer 50 can advantageously involve the use of an etch stop layer, which in particular is used to control the thickness in the support arms.

The layers 48 and 32 are then etched according to the desired pattern in order to form the membrane 54 of the bolometer and the support arms of the membrane 54. Finally, the sacrificial layer 30 is chemically and selectively etched relative to the materials of the layers 32, 48, 50 and 29, thus liberating the membrane 54 that is suspended thanks to the vias 38 (FIG. 1N).

The infrared thermal detector 100 obtained is formed from a central element comprising, in addition to the absorbing elements 46 produced for example in the form of metal strips, thermometric elements corresponding to the superimposed portions of temperature-sensitive materials derived from the three layers 32, 48, 52, the overall thickness of which is substantially greater than the sum of the thicknesses of the layer 32 and 48. In such a case, this results in reduced electrical noise from the thermometric elements according to a law that is inversely proportional to the thickness of the thermometric elements. Said central element is electrically and mechanically connected to the electrically conducting vias 38 by means of arms formed by superimposing the materials of the layers 32, 42 and 48, the thickness of said arms being substantially less than that of the central element. This results in reduced thermal conductance of said arms and, thus, in improved thermal insulation of the central element and improved sensitivity of the detector 100.

At the end of the method, the one or more bolometers produced are placed in a sealed enclosure.

Figure 2:
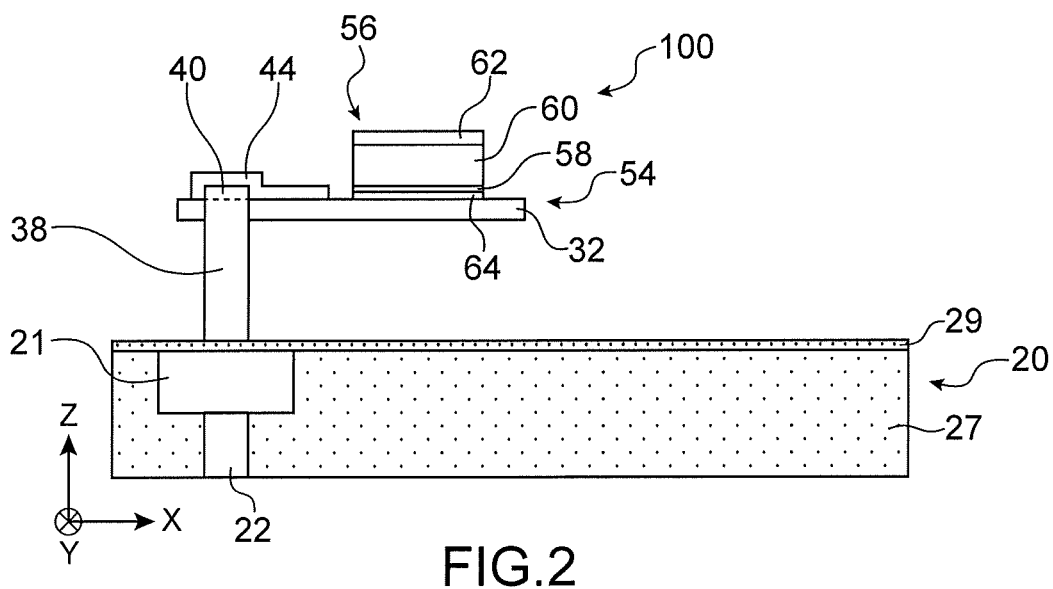
FIG. 2 shows a bolometric detector obtained by implementing a production method according to a second embodiment.

According to a second embodiment, the carrier layer 32 can be used to form the thermometric element of the bolometer of the detector 100, and the absorbing element of the detector can be formed from one or more MIM (Metal-Insulator-Metal) structures made on the membrane of the bolometer. FIG. 2 shows a detector 100 obtained by implementing a method according to said second embodiment, wherein the reference numeral 56 refers to a MIM structure which is formed from a lower metal portion 58, a dielectric portion 60 and an upper metal portion 62. A dielectric portion 64, comprising a dielectric material capable of withstanding the final HF etching, such as AlN or $Al_2O_3$, is positioned between the lower metal portion 58 and the layer 32 in order to electrically insulate the thermometric element formed by the layer 32 relative to the lower metal portion 58. This dielectric portion 64 is, for example, made by depositing a layer of the material of said portion 64 prior to the depositing of the materials of the MIM structure 56, and is etched at the same time as the materials forming the MIM structure 56. In this second embodiment, the MIM structure 56 is formed directly on the etched layer 32 forming the membrane of the bolometer. In this case, the part of the layer 32 forming the membrane assures the thermoelectric signal transduction within the bolometer. The MIM structure 56 in particular provides for the selective absorption of the wavelengths.

As in the first embodiment, the electrical connection between the conductive material present in the membrane of the bolometer and the read-out circuit of the detector is provided by means of the electrodes 44 which directly cover the electrically conducting vias 38.

As a whole, the implementation of the aforementioned steps described with reference to FIG. 1A to 1J allow for the formation of a base for receiving the different elements of the bolometers, i.e. the elements performing the optothermal and thermoelectric signal transductions within the bolometer. The different configurations of these elements described in document EP 2 743 659 A1 can apply when forming the detector 100.

The production method described above can apply for the production of a detector 100 comprising a single bolometer or comprising a plurality of bolometers.

The invention claimed is:

1. A method for producing a bolometric detector comprising at least:
   producing a stack of layers on an electrical interconnect level of an electronic read-out circuit of the detector, the stack comprising at least one sacrificial layer positioned between a carrier layer and a first etch stop layer, the first etch stop layer being positioned between the sacrificial layer and said electrical interconnect level, and the sacrificial layer comprising at least one mineral material capable of being selectively etched relative to the carrier layer and the first etch stop layer;
   forming an opening in the stack of layers including etching through the carrier layer to expose an electrically conducting portion of the electrical interconnect level of said electrical interconnect level connected to the electronic read-out circuit;

producing at least one electrically conducting via in the opening passing through at least the stack of layers such that at least one electrically conducting material of the via is in contact with at least one electrically conducting portion of said electrical interconnect level connected to the electronic read-out circuit;

depositing at least one electrically conducting layer onto the carrier layer and the via;

etching the electrically conducting layer and the carrier layer, forming a bolometer membrane electrically connected to the via by at least one remaining portion of the electrically conducting layer that covers at least one upper part of the via; and eliminating the sacrificial layer by chemical etching to which the first etch stop layer and the carrier layer are resistant, and such that the membrane is suspended by means of the via.

2. The method according to claim 1, wherein the stack of layers further comprises a second etch stop layer such that the carrier layer is positioned between the second etch stop layer and the sacrificial layer, the method further comprising, between the production of the via and the deposition of the electrically conducting layer, the implementation of the following steps of:

removing a layer of electrically conducting material formed on the second etch stop layer during production of the via, then eliminating the second etch stop layer, and wherein the electrically conducting layer is deposited such that the remaining portion of the electrically conducting layer also covers the sides of the upper part of the via uncovered by the elimination of the second etch stop layer.

3. The method according to claim 1, wherein the carrier layer comprises at least one dielectric material or a material wherefor at least one electric parameter varies according to the temperature thereof.

4. The method according to claim 1, further comprising, before the elimination of the sacrificial layer, the production of at least one element for absorbing the infrared radiation intended to be detected by the detector, on the membrane.

5. The method according to claim 4, wherein the absorbing element comprises at least one MIM structure.

6. The method according to claim 1, wherein the electrically conducting layer is etched such that a plurality of remaining portions of said electrically conducting layer form bolometer electrodes and resistive portions capable of absorbing infrared radiation intended to be detected by the detector.

7. The method according to claim 1, further comprising, between the etching of the electrically conducting layer and the etching of the carrier layer, the deposition of a first thermoelectric signal transduction layer on the remaining portions of the electrically conducting layer and on the carrier layer.

8. The method according to claim 7, wherein the first thermoelectric signal transduction layer comprises at least one material that is resistant to the chemical etching process implemented to eliminate the sacrificial layer.

9. The method according to claim 7, further comprising, after the deposition of the first thermoelectric signal transduction layer, the deposition of a second thermoelectric signal transduction layer on the first thermoelectric signal transduction layer, the thickness of which is greater than that of the first thermoelectric signal transduction layer.

10. The method according to claim 1, wherein:
the carrier layer comprises amorphous silicon, and/or
if a first thermoelectric signal transduction layer is deposited, the first thermoelectric signal transduction layer comprises amorphous silicon, and/or
if a second thermoelectric signal transduction layer is deposited, the second thermoelectric signal transduction layer comprises amorphous silicon.

11. The method according to claim 1, comprising forming the bolometer membrane directly connected to the via.

12. The method according to claim 1, wherein producing the at least one electrically conductive via comprises depositing at least one electrically conductive material into the opening passing through at least the stack of layers to reach the at least one electrically conducting portion to form at least one electrically conducting via electrically connected to the electrical interconnect level.

* * * * *